(12) United States Patent
Greenlee et al.

(10) Patent No.: US 12,381,153 B2
(45) Date of Patent: Aug. 5, 2025

(54) MICROELECTRONIC DEVICES, MEMORY DEVICES, AND ELECTRONIC SYSTEMS

(71) Applicant: Micron Technology, Inc., Boise, ID (US)

(72) Inventors: Jordan D. Greenlee, Boise, ID (US); Christian George Emor, Singapore (SG); Luca Fumagalli, Boise, ID (US); John D. Hopkins, Meridian, ID (US); Rita J. Klein, Boise, ID (US); Christopher W. Petz, Boise, ID (US); Everett A. McTeer, Eagle, ID (US)

( * ) Notice: Subject to any disclaimer, the term of this patent is extended or adjusted under 35 U.S.C. 154(b) by 306 days.

(21) Appl. No.: 17/806,438

(22) Filed: Jun. 10, 2022

(65) Prior Publication Data

US 2022/0302032 A1 Sep. 22, 2022

Related U.S. Application Data

(63) Continuation of application No. 16/820,046, filed on Mar. 16, 2020, now Pat. No. 11,393,756.

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76805* (2013.01); *H01L 21/76846* (2013.01);
(Continued)

(58) Field of Classification Search
CPC ............ H01L 23/535; H01L 23/53266; H01L 23/528; H01L 21/76805; H01L 21/76846;
(Continued)

(56) References Cited

U.S. PATENT DOCUMENTS

| 4,540,607 A | 9/1985 | Tsao |
| 4,617,087 A | 10/1986 | Iyer et al. |

(Continued)

FOREIGN PATENT DOCUMENTS

| CN | 101231968 A | 7/2008 |
| CN | 104617191 A | 5/2015 |

(Continued)

OTHER PUBLICATIONS

Chinese First Office Action for Chinese Application No. 202110268041.9, dated Jul. 19, 2024, 25 pages with translation.

*Primary Examiner* — Britt D Hanley
*Assistant Examiner* — Vicki B. Booker
(74) *Attorney, Agent, or Firm* — TraskBritt

(57) ABSTRACT

A microelectronic device includes a first conductive structure, a barrier structure, a conductive liner structure, and a second conductive structure. The first conductive structure is within a first filled opening in a first dielectric structure. The barrier structure is within the first filled opening in the first dielectric structure and vertically overlies the first conductive structure. The conductive liner structure is on the barrier structure and is within a second filled opening in a second dielectric structure vertically overlying the first dielectric structure. The second conductive structure vertically overlies and is horizontally surrounded by the conductive liner structure within the second filled opening in the second dielectric structure. Memory devices, electronic systems, and methods of forming microelectronic devices are also described.

16 Claims, 6 Drawing Sheets

(51) Int. Cl.
*H01L 23/532* (2006.01)
*H10B 41/27* (2023.01)
*H10B 41/35* (2023.01)
*H10B 43/27* (2023.01)
*H10B 43/35* (2023.01)

(52) U.S. Cl.
CPC .. *H01L 21/76849* (2013.01); *H01L 21/76895* (2013.01); *H01L 23/53266* (2013.01); *H10B 41/27* (2023.02); *H10B 41/35* (2023.02); *H10B 43/27* (2023.02); *H10B 43/35* (2023.02)

(58) Field of Classification Search
CPC ......... H01L 21/76849; H01L 21/76895; H01L 21/76843; H01L 21/76867; H01L 21/76876; H01L 21/76883; H01L 21/76802; H01L 21/76831; H01L 2221/101; H01L 2221/1057; H01L 2221/1073; H10B 41/27; H10B 41/35; H10B 41/20; H10B 43/27; H10B 43/35; H10B 43/40; H10B 43/20
See application file for complete search history.

(56) References Cited

U.S. PATENT DOCUMENTS

| | | |
|---|---|---|
| 4,751,101 A | 6/1988 | Joshi |
| 5,227,336 A | 7/1993 | Hirano et al. |
| 5,770,520 A | 6/1998 | Zhao et al. |
| 6,143,362 A | 11/2000 | Sandhu et al. |
| 6,303,480 B1 | 10/2001 | Desai et al. |
| 7,830,016 B2 | 11/2010 | Meldrim et al. |
| 2003/0194858 A1 | 10/2003 | Lee et al. |
| 2004/0175921 A1 | 9/2004 | Cowley et al. |
| 2009/0142925 A1 | 6/2009 | Ha et al. |
| 2015/0001613 A1* | 1/2015 | Yip ................. H10B 43/50 257/329 |
| 2015/0171321 A1 | 6/2015 | Chan et al. |
| 2015/0371899 A1* | 12/2015 | Zhang ............... H01L 21/76874 438/666 |
| 2017/0263455 A1 | 9/2017 | Watanabe et al. |
| 2019/0109006 A1* | 4/2019 | Wang ................. H01L 21/76829 |
| 2019/0273047 A1 | 9/2019 | Yang et al. |
| 2020/0006131 A1* | 1/2020 | Shimabukuro ... H01L 21/76814 |

FOREIGN PATENT DOCUMENTS

| | | |
|---|---|---|
| CN | 105917446 A | 8/2016 |
| CN | 109427842 A | 3/2019 |

* cited by examiner

MICROELECTRONIC DEVICES, MEMORY DEVICES, AND ELECTRONIC SYSTEMS

CROSS-REFERENCE TO RELATED APPLICATION

This application is a continuation of U.S. patent application Ser. No. 16/820,046, filed Mar. 16, 2020, now U.S. Pat. No. 11,393,756, issued Jul. 19, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of individual features and by reducing the separation distance between neighboring features. In addition, microelectronic device designers often seek to design architectures that are not only compact, but offer performance advantages, as well as simplified designs.

Conventional processes for manufacturing a microelectronic device often include forming a dielectric structure on or over a first conductive structure (e.g., conductive contact, conductive plug, conductive pad, conductive line), forming one or more openings extending through the dielectric structure to the first conductive structure, and then filling the opening with a conductive material to form a second conductive structure (e.g., conductive contact, conductive plug, conductive pad, conductive line) in electrical communication with the first conductive structure. A barrier material is frequently formed to line surfaces of the first conductive structure and the dielectric structure defining the opening before forming the second conductive structure. The barrier material may function to impede undesirable interactions (e.g., reactions) between materials used to form the second conductive structure and/or to impede undesirable migration (e.g., diffusion) of elements of the second conductive structure into other structures of the microelectronic device. Unfortunately, conventional methods can suffer from poor step coverage (e.g., of the conductive material of the second conductive structure and/or of the barrier material), especially at relatively higher aspect ratios of the opening, effectuating the formation of undesirable void spaces. In addition, conventional methods may result in less desirable electrical resistance properties (e.g., relatively higher electrical resistance) for the second conductive structure imparted by grain sizes (e.g., relatively small grain sizes) and densities (e.g., relatively high grain densities) of the second conductive structure, and/or relatively smaller horizontal dimensions of the second conductive structure (as compared to the opening), resulting from the horizontal footprint of the barrier material within the opening.

Accordingly, there remains a need for new microelectronic device configurations facilitating enhanced feature density while alleviating the problems of conventional microelectronic device configurations, as well as for new methods of forming the microelectronic devices and new electronic systems including the new microelectronic device configurations.

DETAILED DESCRIPTION

Figure 1B:
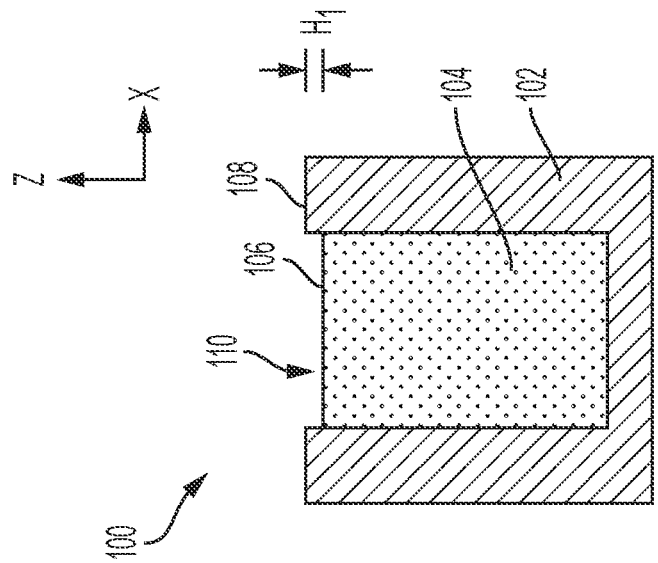
FIGS. 1A through 1G are partial cross-sectional views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the terms "comprising," "including," "having," and grammatical equivalents thereof are inclusive or open-ended terms that do not exclude additional, unrecited elements or method steps, but also include the more restrictive terms "consisting of" and "consisting essentially of" and grammatical equivalents thereof. As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1A through 1G are simplified partial cross-sectional views illustrating embodiments of a method of forming a microelectronic device (e.g., a memory device). The microelectronic devices formed through the methods of the disclosure may comprise microelectronic device structures including filled openings overlying barrier structures, wherein the filled openings include conductive liner structures comprising beta (β) phase tungsten surrounding other conductive structures. With the description provided below, it will be readily apparent to one of ordinary skill in the art that the methods and structures described herein may be used in various devices and electronic systems.

Figure 1A:
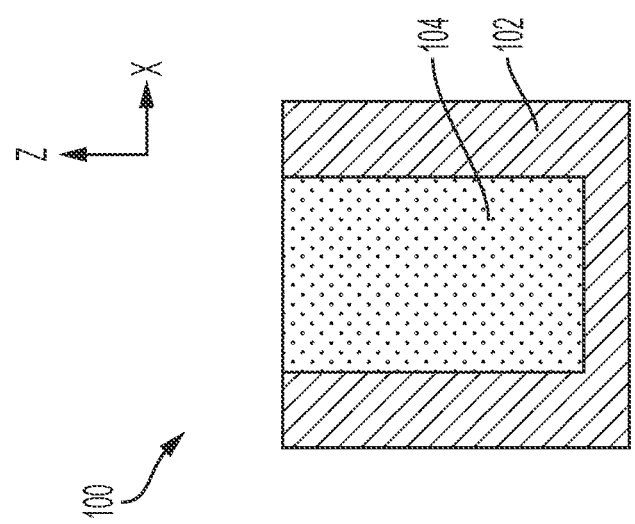

Referring to FIG. 1A, a microelectronic device structure 100 may be formed to include an isolation structure 102, and at least one conductive structure 104 vertically extending (e.g., in the Z-direction) into the isolation structure 102. The conductive structure 104 may be locate within and may at least partially (e.g., substantially) fill at least one opening (e.g., via, trench, aperture) at least partially vertically extending into the isolation structure 102. The isolation structure 102 may be formed in, on, or over a substrate.

The isolation structure 102 may be formed of and include at least one electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the isolation structure 102 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. The isolation structure 102 may include a substantially homogeneous distribution or a substantially heterogeneous distribution of the at least one electrically insulative material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. In some embodiments, the isolation structure 102 exhibits a substantially homogeneous distribution of electrically insulative material. In further embodiments, the isolation structure 102 exhibits a substantially heterogeneous distribution of at least one electrically insulative material. The isolation structure 102 may, for example, be formed of and include a stack (e.g., laminate) of at least two different electrically insulative materials (e.g., at least two different dielectric materials). In some embodiments, the isolation structure 102 is formed of and includes a dielectric oxide material, such as $SiO_x$ (e.g., silicon dioxide ($SiO_2$)).

The conductive structure 104 may be formed of and include at least one electrically conductive material, such as one or more of at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively-doped semiconductor material (e.g., conductively-doped polysilicon, conductively-doped germanium (Ge), conductively-doped silicon germanium (SiGe)), and at least one conductive metal-containing material (e.g., a conductive metal nitride, a conductive metal silicide, a conductive metal carbide, a conductive metal oxide). In some embodiments, the conductive structure 104 is formed of and includes W. The conductive structure 104 may include a substantially homogeneous distribution of the at least one conductive material, or a substantially heterogeneous distribution of the at least one conductive material. In some embodiments, conductive structure 104 exhibits a substantially homogeneous distribution of conductive material. In additional embodiments, conductive structure 104 exhibits a substantially heterogeneous distribution of at least one conductive material. The conductive structure 104 may, for example, be formed of and include a stack of at least two different conductive materials.

The conductive structure 104 may have a desired geometric configuration (e.g., a desired shape and desired dimensions). In some embodiments, the conductive structure 104 is formed to have a geometric configuration permitting the conductive structure 104 to serve as a conductive line structure (e.g., a horizontally extending routing structure) for the microelectronic device structure 100. As a non-limiting example, the conductive structure 104 may be formed to exhibit a rectangular prism shape having a substantially rectangular horizontal cross-sectional shape. In additional embodiments, the conductive structure 104 is formed to have a different geometric configuration, such as a geometric configuration permitting the conductive structure 104 to serve as one or more of a conductive contact structure, a conductive plug structure, and a conductive pad structure for the microelectronic device structure 100. As a non-limiting example, the conductive structure 104 may be formed to exhibit a columnar (e.g., pillar) shape having circular cross-sectional shape, an oblong cross-sectional shape, a an elliptical cross-sectional shape, a square cross-sectional shape, a tear drop cross-sectional shape, a semi-circular cross-sectional shape, a tombstone cross-sectional shape, a crescent cross-sectional shape, a triangular cross-sectional shape, a kite cross-sectional shape, or an irregular cross-sectional shape.

The isolation structure 102 and the conductive structure 104 may be formed using conventional processes (e.g., conventional deposition processes, such as one or more of in situ growth, spin-on coating, blanket coating, CVD, ALD, and PVD; conventional patterning and material removal processes, such as conventional photolithographic exposure processes, conventional development processes, conventional etching processes) and conventional processing equipment, which are not described in detail herein.

Referring next to FIG. 1B, an upper portion of the conductive structure 104 may be selectively removed to form a recessed upper surface 106 of the conductive structure 104. As shown in FIG. 1B, the recessed upper surface 106 of the conductive structure 104 may be vertically offset (e.g., in the Z-direction) from an upper surface 108 of the isolation structure 102 by a height $H_1$ (e.g., depth, vertical distance). The height $H_1$ may be selected at least partially based on a predetermined thickness of a barrier structure to subsequently be formed on or over surfaces of the conductive structure 104 and the isolation structure 102, as described in further detail below. By way of non-limiting example, the height $H_1$ may be within a range of from about 2 nanometers (nm) to about 200 nm, such as from about 2 nm to about 100 nm, from about 2 nm to about 50 nm.

As shown in FIG. 1B, the selective removal of the upper portion of the conductive structure 104 forms a trench 110 at least partially defined by the recessed upper surface 106 of the conductive structure 104 and exposed upper portions of side surfaces (e.g., sidewalls) of the isolation structure 102. The trench 110 may have a horizontal shape and horizontal dimensions (e.g., width, length) corresponding to (e.g., substantially the same as) a horizontal shape and horizontal dimensions of the conductive structure 104.

The upper portion of the conductive structure 104 may be selectively removed by treating the microelectronic device structure 100 with at least one etchant (e.g., at least one wet etchant) formulated to remove exposed portions of the conductive structure 104 without substantially removing exposed portions of the isolation structure 102. The microelectronic device structure 100 may be exposed to the etchant using conventional processes (e.g., spin-coating process, a spray-coating process, an immersion-coating process, a vapor-coating process, a soaking process, combinations thereof) and conventional processing equipment, which are not described in detail herein.

Figure 1D:
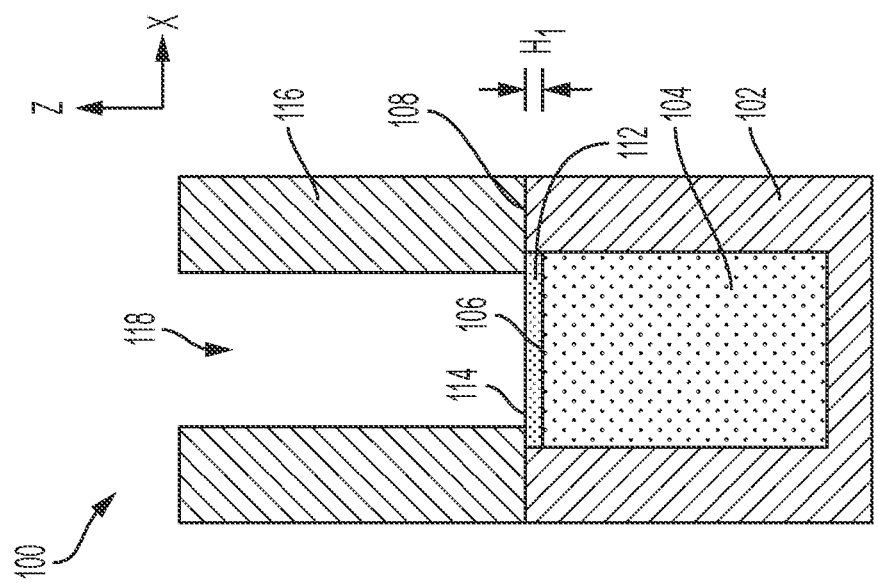
Figure 1C:
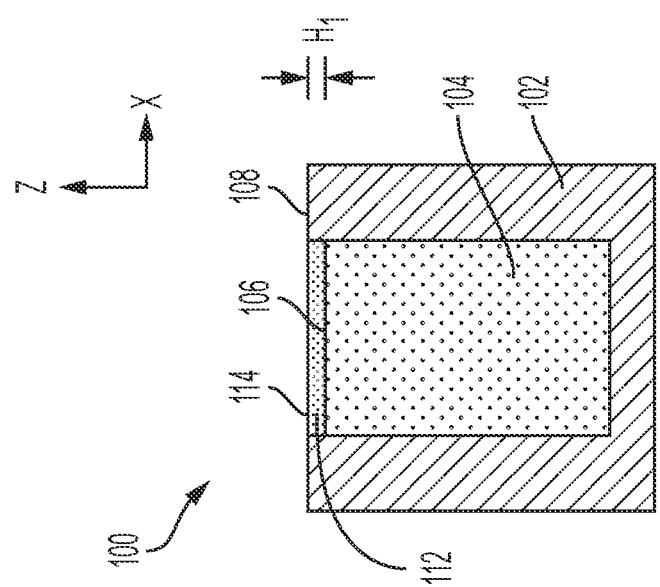

Referring next to FIG. 1C, a barrier structure 112 may be formed within the trench 110 (FIG. 1B). The barrier structure 112 may be formed on or over the recessed upper surface 106 of the conductive structure 104 and the exposed upper portions of side surfaces of the isolation structure 102. The barrier structure 112 may substantially fill the trench 110 (FIG. 1B), and may be confined within boundaries (e.g., horizontal boundaries, vertical boundaries) of the trench 110 (FIG. 1B). As shown in FIG. 1C, an upper surface 114 of the barrier structure 112 may be substantially coplanar with the upper surface 108 of the isolation structure 102. Put another way, a vertically uppermost boundary of the barrier structure 112 may be substantially coplanar with a vertically uppermost boundary of the isolation structure 102.

The barrier structure 112 may be formed of and include at least one barrier material that protects the electrically conductive material of the conductive structure 104 from undesirable interactions (e.g., reactions) with one or more materials employed to form one or more additional structures vertically over the conductive structure 104. By way of non-limiting example, the barrier material of the barrier structure 112 may protect the electrically conductive material (e.g., tungsten (W)) of the conductive structure 104 from interactions with silicon-containing materials (e.g., silane ($SiH_4$), disilane ($Si_2H_6$)) employed to form additional structures over the conductive structure 104 that may otherwise produce undesirable metal silicide materials (e.g., tungsten silicide ($WSi_x$)) having greater electrical resistivity than the electrically conductive material of the conductive structure 104. In some embodiments, the barrier structure 112 comprises one or more of a tantalum-containing material, a tungsten-containing material, a titanium-containing material, a cobalt-containing material, a manganese-containing material, and a ruthenium-containing material. For example, the barrier structure 112 may be formed of and include one or more of elemental tantalum (Ta), a tantalum nitride ($TaN_y$), elemental tungsten (W), a tungsten nitride ($WN_y$), a tungsten carbonitride ($WC_xN_y$), elemental titanium (Ti), a titanium nitride ($TiN_y$), elemental cobalt (Co), and elemental manganese (Mn). In some embodiments, the barrier structure 112 is formed of and includes $TiN_y$.

The barrier structure 112 may have any thickness able to substantially prevent undesirable interactions between materials of and/or used to form at least one structure neighboring the barrier structure 112 and at least one other structure neighboring the barrier structure 112. The thickness of the barrier structure 112 may be less than or equal to (e.g., may be substantially equal to) the height $H_1$ of the trench 110 (FIG. 1B). By way of non-limiting example, the thickness of the barrier structure 112 may be within a range of from about 2 nm to about 200 nm, such as from about 2 nm to about 100 nm, from about 2 nm to about 50 nm.

The barrier structure 112 may be formed using conventional processes (e.g., conventional material deposition processes, conventional material removal processes) and conventional processing equipment, which are not described in detail herein. For example, a barrier material may be deposited (e.g., conformally deposited through one or more of an ALD process and a conformal CVD process) on surfaces of the isolation structure 102 and the conductive structure 104 inside and outside of the trench 110 (FIG. 1B), and then at least portions of the barrier material outside of the boundaries of the trench 110 (FIG. 1B) may be removed (e.g., through at least one CMP process) to form the barrier structure 112.

Referring next to FIG. 1D, an additional isolation structure 116 may be formed on or over the upper surface 108 of the isolation structure 102 and the upper surface 114 of the barrier structure 112, and then at least one opening 118 (e.g., trench, via, aperture) may be formed in the additional isolation structure 116 to expose at least a portion of the upper surface 114 of the barrier structure 112. As shown in FIG. 1D, the upper surface 114 of the barrier structure 112 may at least partially define a lower vertical boundary (e.g., floor, bottom) of the opening 118, and side surfaces (e.g., sidewalls) of the additional isolation structure 116 may at least partially define a horizontal boundaries (e.g., sides) of the opening 118.

The additional isolation structure 116 may be formed of and include at least one electrically insulative material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_g$), at least one dielectric oxynitride material (e.g., $SiO_xN_y$), and at least one dielectric carboxynitride material (e.g., $SiO_xC_zN_y$). The additional isolation structure 116 may include a substantially homogeneous distribution or a substantially heterogeneous distribution of the at least one electrically insulative material. In some embodiments, the additional isolation structure 116 exhibits a substantially homogeneous distribution of electrically insulative material. In further embodiments, the additional isolation structure 116 exhibits a substantially heterogeneous distribution of at least one electrically insulative material. The additional isolation structure 116 may, for example, be formed of and include a stack (e.g., laminate) of at least two different electrically insulative materials (e.g., at least two different dielectric materials). A material composition of the additional isolation structure 116 may be substantially the same as a material composition of the isolation structure 102, or the material composition of the additional isolation structure 116 may be different than the material composition of the isolation structure 102. In some embodiments, the additional isolation structure 116 is formed of and includes a dielectric oxide material, such as $SiO_x$ (e.g., $SiO_2$).

The opening 118 within the additional isolation structure 116 may be formed to exhibit a desired geometric configuration (e.g., a desired shape and desired dimensions). The geometric configuration of the opening 118 may at least partially depend upon a geometric configuration of the conductive structure 104 (and, hence, the barrier structure 112) and on geometric configurations of additional structures (e.g., liner structures, additional conductive structures) to be formed within the opening 118, as described in further detail below. In some embodiments, the opening 118 is formed to exhibit a horizontal cross-sectional shape substantially the same as a horizontal cross-sectional shape of the conductive structure 104, and a horizontal width (e.g., in the X-direction) less than or equal to (e.g., less than) a horizontal width of the conductive structure 104. In additional embodiments, the opening 118 is formed to exhibit a horizontal cross-sectional shape different than a horizontal cross-sectional shape of the conductive structure 104, and/or a horizontal width (e.g., in the X-direction) greater than a horizontal width of the conductive structure 104.

The opening 118 within the additional isolation structure 116 may be provided at a desired horizontal location (e.g., in the X-direction, in another horizontal direction orthogonal to the X-direction) on or over the barrier structure 112. As shown in FIG. 1D, in some embodiments, the opening 118 is substantially horizontally centered (e.g., in the X-direction) on the barrier structure 112 (and, hence, the conductive structure 104). In additional embodiments, the opening 118 is horizontally offset (e.g., in the X-direction) from a horizontal center (e.g., in the X-direction) of the barrier structure 112 associated therewith (e.g., at least partially uncovered thereby).

The additional isolation structure 116 and the opening 118 within the additional isolation structure 116 may be formed using conventional processes (e.g., conventional material deposition processes, conventional material removal processes) and conventional processing equipment, which are not described in detail herein. For example, the additional isolation structure 116 may be formed on or over the isolation structure 102 and the barrier structure 112 using at least one material deposition process (e.g., one or more of spin-on coating, blanket coating, CVD, ALD, and PVD), and then one or more portions thereof may be selectively subjected to anisotropic etching (e.g., anisotropic dry etching, such as one or more of RIE, deep RIE, plasma etching, reactive ion beam etching, and chemically assisted ion beam etching) to form the opening 118.

Figure 1E:
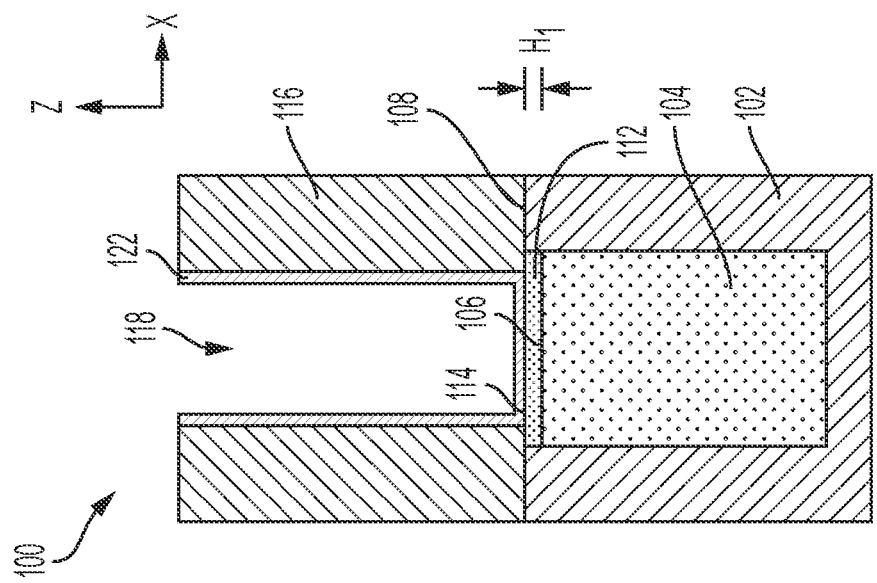

Referring next to FIG. 1E, a semiconductive liner structure 120 may be formed within the opening 118. The semiconductive liner structure 120 may partially (e.g., less than completely) fill the opening 118, and may cover exposed horizontally extending surfaces and exposed vertically extending surfaces of the microelectronic device structure 100 inside boundaries (e.g., horizontal boundaries, vertical boundaries) of the opening 118. For example, the semiconductive liner structure 120 may be formed vertically on or over a portion of the upper surface 114 of the barrier structure 112 exposed within the opening 118, and horizontally on or over side surfaces of the additional isolation structure 116 exposed within the opening 118.

The semiconductive liner structure 120 may be formed of and include of at least one semiconductive material, such as one or more of a silicon material, a silicon-germanium material, a boron material, a germanium material, a gallium arsenide material, a gallium nitride material, and an indium phosphide material. By way of non-limiting example, the semiconductive liner structure 120 may be formed of and include at least one silicon material. As used herein, the term "silicon material" means and includes a material that includes elemental silicon or a compound of silicon. The semiconductive liner structure 120 may, for example, be formed of and include one or more monocrystalline silicon and polycrystalline silicon. In some embodiments, the semiconductive liner structure 120 comprises polycrystalline silicon.

Optionally, the semiconductive material of semiconductive liner structure 120 may be doped with one or more dopant(s). The dopant(s), if any, may for example comprise material(s) promoting subsequent formation of tungsten (e.g., β-phase tungsten) from the semiconductive material of semiconductive liner structure 120, as described in further detail below. In some embodiments, the dopant(s) comprise at least one N-type dopant, such as one or more of phosphorus (P), arsenic (Ar), antimony (Sb), and bismuth (Bi). In additional embodiments, the dopant(s) comprise at least one P-type dopant, such as one or more of boron (B), aluminum (Al), and gallium (Ga). In further embodiments, the dopant(s) comprise one or more of carbon (C), fluorine (F), chlorine (Cl), bromine (Br), hydrogen (H), deuterium ($^2$H), helium (He), neon (Ne), and argon (Ar).

A thickness of the semiconductive liner structure 120 may at least partially depend on the dimensions (e.g., width in the X-direction, height in the Z-direction) of the opening 118 and on dimensions of additional materials and structures to be formed within the opening 118. By way of non-limiting example, the thickness of the semiconductive liner structure 120 may be within a range of from about one (1) nm to about 10 nm, such as from about 1 nm to about 8 nm, or from about 1 nm to about 5 nm. In some embodiments, the semiconductive liner structure 120 is formed to exhibit a thickness within a range of from about 2 nm to about 4 nm. In addition, the semiconductive liner structure 120 be formed to be substantially homogeneous throughout the thickness thereof, or the semiconductive liner structure 120 may formed to be heterogeneous throughout the thickness thereof. In some embodiments, the semiconductive liner structure 120 is formed to be substantially homogeneous throughout the thickness thereof.

The semiconductive liner structure 120 may be formed using one or more conventional processes (e.g., conventional material deposition processes, such as conventional conformal material deposition processes; conventional material removal processes, such as conventional planarization processes) and conventional process equipment, which are not described in detail herein. By way of non-limiting example, a semiconductive liner material may be conformally deposited (e.g., through one or more of an ALD process and a conformal CVD process) at least on surfaces of the barrier structure 112 and the additional isolation structure 116 inside and outside of the opening 118, and then at least portions of the semiconductive liner material outside of the boundaries of the opening 118 may be removed (e.g., through at least one CMP process) to form the semiconductive liner structure 120. In addition, the semiconductive liner material may, optionally, be doped with one or more dopant(s) using one or more of a conventional material implantation process and a conventional material diffusion process.

Figure 1F:
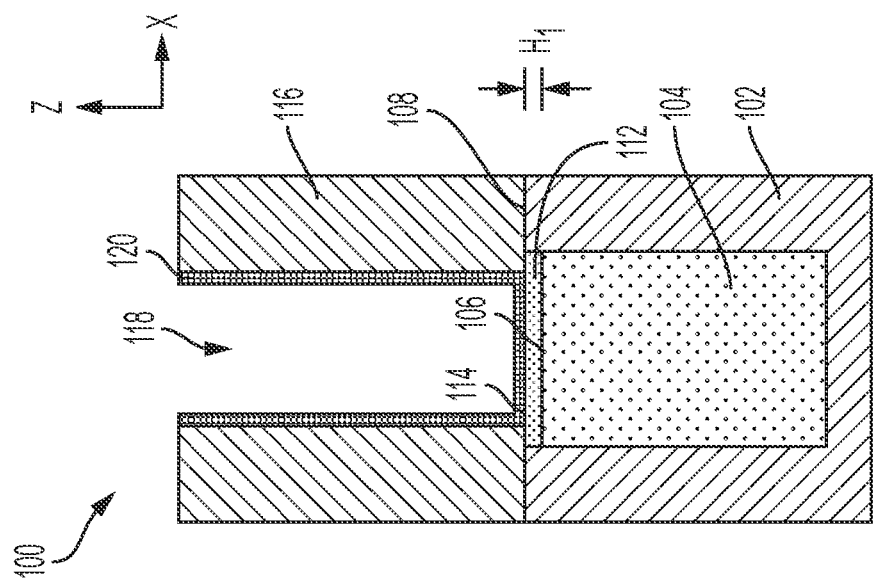

Referring next to FIG. 1F, the semiconductive liner structure 120 (FIG. 1E) may be converted into a tungsten liner structure 122. The conversion process may convert the semiconductive material (e.g., silicon material, such as polycrystalline silicon) of the semiconductive liner structure 120 (FIG. 1E) into tungsten. At least some of the tungsten of the tungsten liner structure 122 may comprise β-phase tungsten. β-phase tungsten has a metastable, A15 cubic structure. Grains of the β-phase tungsten may exhibit generally columnar shapes. Tungsten included within the tungsten liner structure 122 may only be present in the β-phase, or may be present in the β-phase and in the alpha (α) phase. If present, the α-phase tungsten has a metastable, body-centered cubic structure. Grains of the α-phase tungsten may exhibit generally isometric shapes. If the tungsten liner structure 122 includes β-phase tungsten and α-phase tungsten, an amount of β-phase tungsten included in the tungsten liner structure 122 may be different than an amount of α-phase tungsten included in the tungsten liner structure 122, or may be substantially the same as amount of α-phase tungsten included in the tungsten liner structure 122. In some embodiments, an amount of β-phase tungsten included in the tungsten liner structure 122 is greater than an amount of α-phase tungsten included in the tungsten liner structure 122. For example, at least a majority (e.g., greater than 50 percent, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the tungsten liner structure 122 may be present in the β-phase.

In embodiments wherein one or more dopant(s) are included in the semiconductive liner structure 120 (FIG. 1E), the one or more dopant(s) may also be included in the tungsten liner structure 122. In some embodiments, the tungsten liner structure 122 is formed to be substantially free of dopants distributed within the β-phase tungsten thereof. In additional embodiments, the tungsten liner structure 122 is formed to include β-phase tungsten doped with one or more N-type dopants (e.g., one or more of P, Ar, Sb, and Bi). In further embodiments, the tungsten liner structure 122 is formed to include β-phase tungsten doped with one or more P-type dopants (e.g., one or more of B, Al, and Ga). In yet further embodiments, the tungsten liner structure 122 is formed to include β-phase tungsten doped with one or more of C, F, Cl, Br, H, $^2$H, He, Ne, and Ar. If present, the dopant(s) of the tungsten liner structure 122 may, for example, support (e.g., facilitate, promote) the stability of the β-phase tungsten of the tungsten liner structure 122.

The thickness of the tungsten liner structure 122 may be less than or equal to the thickness of the semiconductive liner structure 120 (FIG. 1F). As a non-limiting example, the thickness of the tungsten liner structure 122 may be less than or equal to the thickness of the semiconductive liner structure 120 and within a range of from about one (1) nm to about 10 nm, such as from about 1 nm to about 8 nm, or from about 1 nm to about 5 nm. In some embodiments, the tungsten liner structure 122 is formed to exhibit a thickness within a range of from about 2 nm to about 4 nm.

The tungsten liner structure 122 may be formed by treating the semiconductive liner structure 120 (FIG. 1E) with one or more chemical species facilitating the conversion of the semiconductive material (e.g., silicon material) thereof into tungsten (e.g., β-phase tungsten, α-phase tungsten). By way of non-limiting example, if the semiconductive liner structure 120 (FIG. 1E) comprises a silicon material, such as polycrystalline silicon, the semiconductive liner structure 120 (FIG. 1E) may be treated with tungsten hexafluoride (WF$_6$) to form the tungsten liner structure 122. Silicon (Si) of the semiconductive liner structure 120 (FIG. 1E) may react with the WF$_6$ to produce tungsten (W) and silicon tetrafluoride (SiF$_4$). The produced SiF$_4$ is removed as a gas. The produced W remains to form the tungsten liner structure 122. The semiconductive liner structure 120 (FIG. 1E) may, for example, be treated with WF$_6$ using a conventional CVD apparatus at a temperature within a range of from about 200° C. to about 500° C.

Figure 1G:
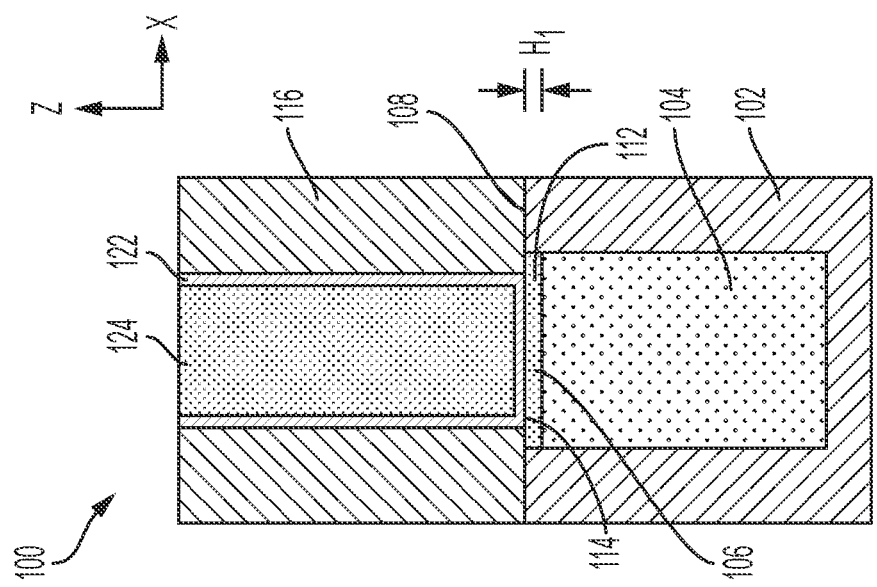

Referring next to FIG. 1G, an additional conductive structure 124 may be formed on or over the tungsten liner structure 122 within the opening 118 (FIG. 1F). The additional conductive structure 124 may at least partially (e.g., substantially) fill a remainder of the opening 118 (FIG. 1F) not occupied by the tungsten liner structure 122. The additional conductive structure 124 may be substantially confined within boundaries (e.g., vertical boundaries, horizontal boundaries) of the opening 118 (FIG. 1F). Inner side surfaces and an upper surface of the tungsten liner structure 122 may respectively define horizontal boundaries and a lower vertical boundary of the additional conductive structure 124. In addition, an upper vertical boundary of the additional conductive structure 124 may be substantially coplanar with upper vertical boundaries of the additional isolation structure 116 and the tungsten liner structure 122.

The additional conductive structure 124 may be formed of and include at least one electrically conductive material, such as one or more of a metal (e.g., W, Ti, Mo, Nb, V, Hf, Ta, Cr, Zr, Fe, Ru, Os, Co, Rh, Jr, Ni, Pd, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). A material composition of the additional conductive structure 124 may be substantially the same as a material composition of the conductive structure 104, or a material composition of the additional conductive structure 124 may be different than a material composition of the conductive structure 104. In some embodiments, the additional conductive structure 124 is formed of and includes tungsten (W).

At least some (e.g., at least a majority, substantially all) of the electrically conductive material (e.g., tungsten) of the additional conductive structure 124 may have a different crystalline phase structure than that of at least some (e.g., at least a majority, substantially all) of the tungsten of the tungsten liner structure 122. By way of non-limiting example, the additional conductive structure 124 may be formed to comprise α-phase tungsten. Tungsten included within the additional conductive structure 124 may only be present in the α-phase, or may be present in the α-phase and in the β-phase. If the additional conductive structure 124 includes α-phase tungsten and β-phase tungsten, amounts of α-phase tungsten included in the additional conductive structure 124 may be greater than amounts of β-phase tungsten included in the additional conductive structure 124. For example, at least a majority (e.g., greater than 50 percent, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the additional conductive structure 124 may be present in the α-phase. In some embodiments, the additional conductive structure 124 is formed of and includes α-phase tungsten, and the tungsten liner structure 122 is formed of and includes β-phase tungsten. In additional embodiments, the additional conductive structure 124 and the conductive structure 104 are each formed of and include α-phase tungsten, and the tungsten liner structure 122 is formed of and includes β-phase tungsten.

In some embodiments, the tungsten liner structure 122 serves as a seed layer (e.g., a nucleation layer) for the formation of the additional conductive structure 124. In such embodiments, the β-phase tungsten of the tungsten liner structure 122 may facilitate relativity larger grain size within the additional conductive structure 124 than if the additional conductive structure 124 was formed in the absence of the tungsten liner structure 122. The grain size of the additional conductive structure 124 may, for example, be substantially similar to the grain size of the tungsten liner structure 122. As a result, the additional conductive structure 124 may have relatively lower resistivity than may otherwise be achieved if the additional conductive structure 124 was formed without employing the tungsten liner structure 122 as a seed layer.

The additional conductive structure 124 may be formed within the opening 118 (FIG. 1F) through conventional processes (e.g., conventional material deposition processes, such as one or more of a conventional CVD process, a conventional PVD process, and a conventional ALD process; conventional material removal processes, such as a conventional CMP process) and conventional processing equipment, which are not described in detail herein.

Following the formation of the additional conductive structure 124, the microelectronic device structure 100 may be subjected to further processing, as desired. In some embodiments, following the formation of the microelectronic device structure 100, the microelectronic device structure 100 is subjected to at least one thermal treatment process to at least partially (e.g., substantially) convert the β-phase tungsten of the tungsten liner structure 122 into α-phase tungsten. The thermal treatment process may, for example, including heating the tungsten liner structure 122 to a temperature greater than or equal to about 700° C. (e.g., within a range of from about 700° C. to about 800° C.) to convert the β-phase tungsten thereof to α-phase tungsten. In additional embodiments, the β-phase tungsten of the tungsten liner structure 122 is not converted to α-phase tungsten after the formation of the additional conductive structure 124.

Thus, in accordance with embodiments of the disclosure, a microelectronic device comprises a first conductive structure, a barrier structure, a conductive liner structure, and a second conductive structure. The first conductive structure is within a first filled opening in a first dielectric structure. The barrier structure is within the first filled opening in the first dielectric structure and vertically overlies the first conductive structure. The conductive liner structure is on the barrier structure and is within a second filled opening in a second dielectric structure vertically overlying the first dielectric structure. The second conductive structure vertically overlies and is horizontally surrounded by the conductive liner structure within the second filled opening in the second dielectric structure.

Furthermore, in accordance with embodiments of the disclosure, a method of forming a microelectronic device comprises forming a first conductive structure within a first opening in a first dielectric structure. A barrier structure is formed within the first opening and over the first conductive structure. A second dielectric structure is formed over the barrier structure and the first dielectric structure. A second opening is formed in the second dielectric structure to expose an upper surface of the barrier structure. A conductive liner structure is formed within the second opening in the second dielectric structure. The conductive liner structure partially fills the second opening and is in contact with the upper surface of the barrier structure and at least one side surface of the second dielectric structure. A second conductive structure is formed to fill remaining space within the second opening in the second dielectric structure after forming the conductive liner structure.

Figure 2:
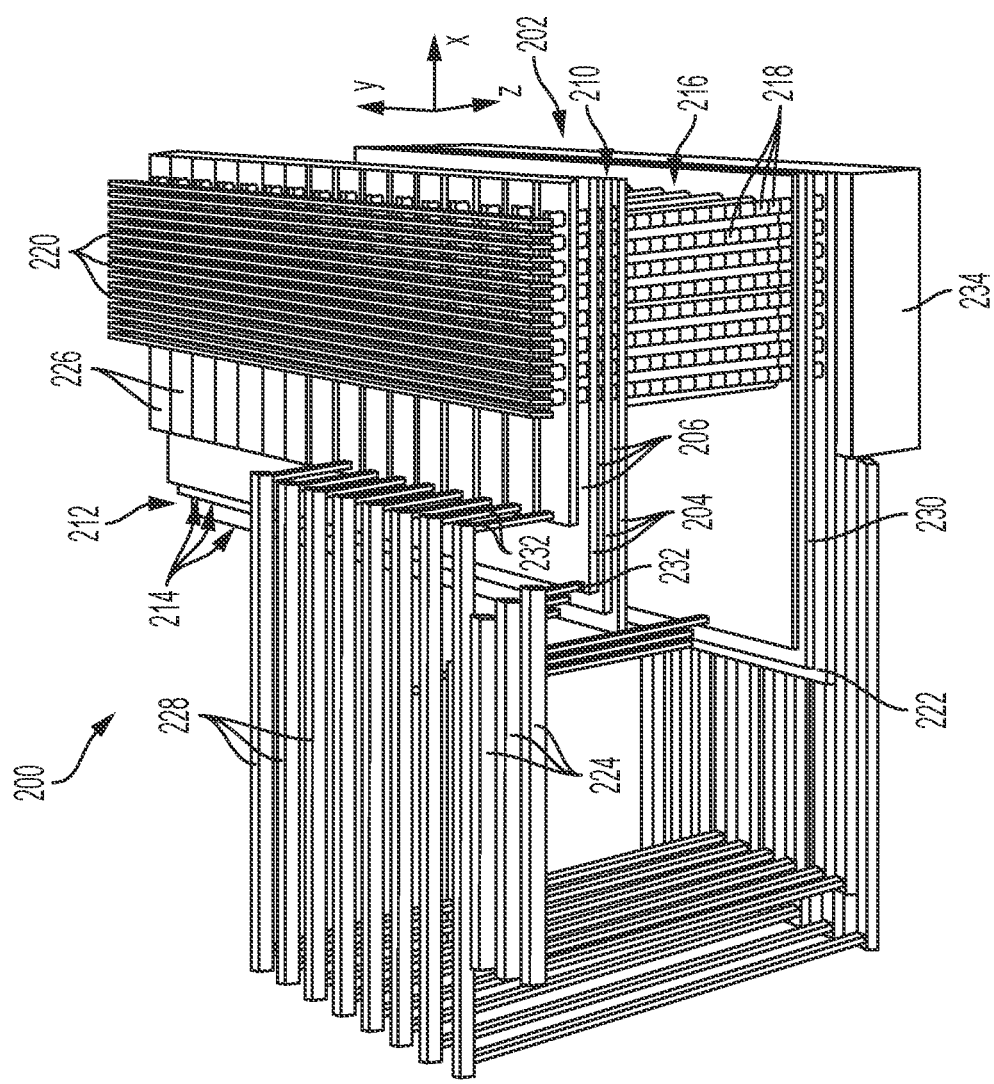
FIG. 2 is a simplified partial cutaway perspective view of a microelectronic device, in accordance with embodiments of the disclosure.

Microelectronic device structures (e.g., the microelectronic device structure 100 previously described with reference to FIG. 1G) according to embodiments the disclosure may be used in embodiments of microelectronic devices of the disclosure. For example, FIG. 2 illustrates a partial cutaway perspective view of a microelectronic device 200 (e.g., a memory device, such as a 3D NAND Flash memory device), in accordance with embodiments of the disclosure. One or more portions of the microelectronic device 200 may include, for example, an embodiment of the microelectronic device structure 100 following the process stage previously described with reference to FIG. 1G.

As shown in FIG. 2, the microelectronic device 200 may include a stack structure 202 having a vertically alternating (e.g., in the Z-direction) sequence of conductive structures 204 and insulative structures 206 arranged in tiers 210; staircase structures 212 having steps 214 defined by edges (e.g., horizontal ends in the X-direction) of the tiers 210. In addition, the microelectronic device 200 may further include vertical strings 216 of memory cells 218 coupled to each other in series, data lines 220 (e.g., bit lines), a source structure 222, access lines 224, first select gates 226 (e.g., upper select gates, drain select gates (SGDs)), select lines 228, second select gates 230 (e.g., lower select gates, source select gate (SGSs)), contact structures 232, and a control unit 234 (e.g., a control device). The vertical strings 216 of memory cells 218 extend vertically and orthogonal to conductive lines and tiers (e.g., the data lines 220, the source structure 222, the tiers 210 of the stack structure 202, the access lines 224, the first select gates 226, the select lines 228, the second select gates 230). The contact structures 232 may electrically couple components to each other as shown (e.g., the select lines 228 to the first select gates 226, the access lines 224 to the tiers 210 of the stack structure 202). The control unit 234 may be positioned vertically below the vertical strings 216 of memory cells 218, and may include one or more of string driver circuitry, pass gates, circuitry for selecting gates, circuitry for selecting conductive lines (e.g., the access lines 224, the select lines 228, the data lines 220, additional access lines, additional select lines, additional data lines), circuitry for amplifying signals, and circuitry for sensing signals. In some embodiments, the control unit 234 is at least partially (e.g., substantially) positioned within horizontal boundaries (e.g., in the X-direction and the Y-direction) of a horizontal area occupied by the vertical strings 216 of memory cells 218. The control unit 234 may, for example, be electrically coupled to the data lines 220, the source structure 222, the access lines 224, and select lines 228. In some embodiments, the control unit 234 includes CMOS (complementary metal-oxide-semiconductor) circuitry. In such embodiments, the control unit 234 may be characterized as having a "CMOS under Array" ("CuA") configuration.

The microelectronic device structure 100 previously described with reference to FIG. 1G may be employed at one or more locations within the microelectronic device 200. By way of non-limiting example, one or more locations within the microelectronic device 200 including neighboring conductive structures in electrical communication with one another may exhibit the configuration of the microelectronic device structure 100 at the processing stage previously described with reference to FIG. 1G. In some embodiments, the data lines 220 each individually have a configuration corresponding to that of the additional conductive structure 124 (FIG. 1G), some of the contact structures 232 in electrical communication with the data lines 220 each individually have a configuration corresponding to that of the conductive structure 104 (FIG. 1G), and additional structures having configurations corresponding to those of the barrier structure 112 (FIG. 1G) and the tungsten liner structure 122 are interposed between the data lines 220 and the contact structures 232 in electrical communication therewith. In additional embodiments, the conductive structures 204 of the stack structure 202 each individually have a configuration corresponding to that of the additional conductive structure 124 (FIG. 1G), some of the contact structures 232 in electrical communication with the conductive structures 204 each individually have a configuration corresponding to that of the conductive structure 104 (FIG. 1G), and additional structures having configurations corresponding to those of the barrier structure 112 (FIG. 1G) and the tungsten liner structure 122 are interposed between the conductive structures 204 and the contact structures 232 in electrical communication therewith.

Thus, in accordance with embodiments of the disclosure, a memory device comprises at least one conductive structure, at least one barrier structure, at least one additional conductive structure, and at least one memory cell. The at least one conductive structure comprises a first conductive material comprising alpha phase tungsten, and a second conductive material surrounding and in physical contact with the first conductive material and comprising beta phase tungsten. The at least one barrier structure underlies and is in physical contact with the second conductive material of the at least one conductive structure. The at least one additional conductive structure underlies and is in physical contact with the at least one barrier structure. The at least one memory cell is electrically coupled to the at least one conductive structure and the at least one additional conductive structure.

Figure 3:
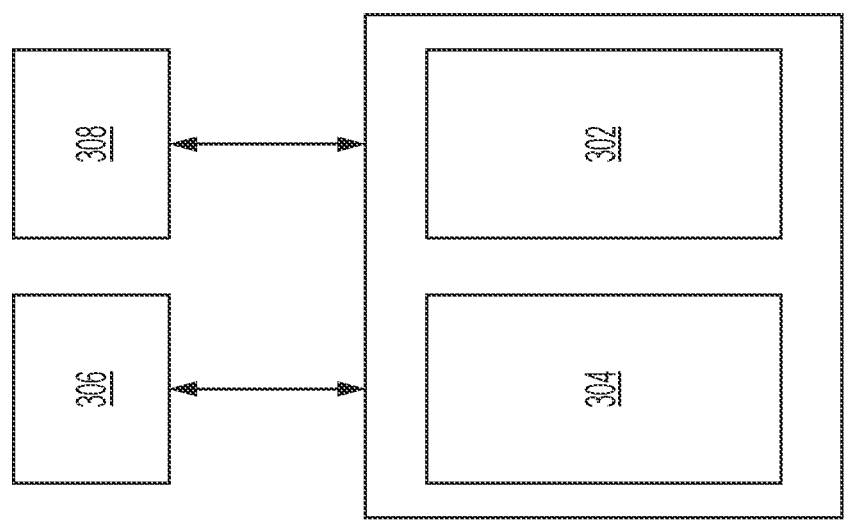
FIG. 3 is a schematic block diagram illustrating an electronic system, in accordance with embodiments of the disclosure.
Figure 3:
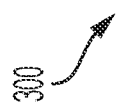

Microelectronic device structures (e.g., the microelectronic device structure 100 previously described with reference to FIG. 1G) and microelectronic devices (e.g., the microelectronic device 200 previously described with reference to FIG. 2) according to embodiments the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a microelectronic device structure (e.g., the microelectronic device structure 100 previously described with reference to FIG. 1G) and a microelectronic device (e.g., the microelectronic device 200 previously described with reference to FIG. 2) previously described herein. The electronic system 300 may further include at least one electronic signal processor device 304 (often referred to as a "microprocessor"). The electronic signal processor device 304 may, optionally, include an embodiment of one or more of a microelectronic device structure (e.g., the microelectronic device structure 100 previously described with reference to FIG. 1G) and a microelectronic device (e.g., the microelectronic device 200 previously described with reference to FIG. 2) previously described herein. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure and a microelectronic device previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, one or more of a monitor, a display, a printer, an audio output jack, and a speaker. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises a microelectronic device structure comprising a conductive structure, a barrier structure, a conductive liner structure, and an additional conductive structure. The conductive structure comprises alpha phase tungsten. The barrier structure is on an upper surface of the conductive structure and comprises a conductive metal nitride. The conductive liner structure is on an upper surface of the barrier structure and comprises beta phase tungsten. The additional conductive structure is vertically on and substantially horizontally surrounded by the conductive liner structure. The additional conductive structure comprises additional alpha phase tungsten.

The methods, structures (e.g., the microelectronic device structure 100), devices (e.g., the microelectronic device 200), and systems (e.g., the electronic system 300) of the disclosure advantageously facilitate one or more of improved performance, reliability, and durability, lower costs, increased miniaturization of components, improved pattern quality, and greater packaging density as compared to conventional structures, conventional devices, and conventional systems. The methods, structures, and devices of the disclosure may alleviate problems related to the formation, processing, and/or operation of conventional microelectronic devices including conventional configurations of conductive structures (e.g., contact structures, conductive line structures) neighboring and in electrical communication with one another. As a non-limiting example, the methods of the disclosure may facilitate relatively lower resistivity and improved performance for relatively high aspect ratio (HAR) conductive structures (e.g., conductive structure having a ratio of vertical height to horizontal width greater than or equal to about 5:1, such as within a range of from about 5:1 to about 100:1) vertically neighboring and in electrical communication with additional conductive structures as compared to conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
a conductive metal nitride structure on a conductive structure and having a substantially planar upper surface;
an isolation structure in physical contact with side surfaces of the conductive structure and the conductive metal nitride structure, the substantially planar upper surface of the conductive metal nitride structure substantially coplanar with an upper surface of the isolation structure; and
an additional conductive structure vertically overlying and at least partially horizontally overlapping the conductive metal nitride structure; and
a conductive liner structure comprising beta phase tungsten interposed between the conductive metal nitride structure and the additional conductive structure, portions of the conductive liner structure substantially covering sidewalls of the additional conductive structure; and
an additional isolation structure on the isolation structure and the conductive metal nitride structure, the portions of conductive liner structure horizontally extending from sidewalls of the additional isolation structure to the sidewalls of the additional conductive structure.

2. The microelectronic device of claim 1, wherein the conductive liner structure consists of beta phase tungsten.

3. The microelectronic device of claim 1, wherein the conductive liner structure further comprises alpha phase tungsten.

4. The microelectronic device of claim 1, wherein the conductive liner structure has a thickness within a range of from about 2 nm to about 4 nm.

5. A microelectronic device, comprising:
a conductive metal nitride structure on a conductive structure and having a substantially planar upper surface;
an isolation structure in physical contact with side surfaces of the conductive structure and the conductive metal nitride structure, the substantially planar upper surface of the conductive metal nitride structure substantially coplanar with an upper surface of the isolation structure; and
an additional conductive structure vertically overlying and at least partially horizontally overlapping the conductive metal nitride structure; and
a conductive liner structure comprising beta phase tungsten interposed between the conductive metal nitride structure and the additional conductive structure, portions of the conductive liner structure substantially covering sidewalls of the additional conductive structure; and
an additional isolation structure on the isolation structure and the conductive metal nitride structure, the portions of conductive liner structure horizontally interposed between sidewalls of the additional isolation structure and the sidewalls of the additional conductive structure, and an uppermost boundary of the conductive liner structure substantially coplanar with an upper surface of the additional isolation structure.

6. A memory device, comprising:
a stack structure comprising tiers each comprising conductive material and insulative material vertically adjacent the conductive material;
a source structure underlying the stack structure;
strings of memory cells vertically extending through the stack structure and coupled to the source structure;
conductive contact structures coupled to the strings of memory cells;
conductive metal nitride structures on the conductive contact structures, each of the conductive metal nitride structures having a substantially planar upper boundary;
digit line structures vertically overlying the conductive metal nitride structures and extending in parallel in a first horizontal direction, the digit line structures individually substantially centered about one of the conductive metal nitride structures and one of the conductive contact structures in a second horizontal direction orthogonal to the first horizontal direction; and
conductive liner structures comprising beta phase tungsten interposed between the conductive metal nitride structures and the digit line structures, the conductive liner structures in physical contact with lower surfaces and side surfaces of the digit line structures.

7. The memory of claim 6, further comprising:
a first dielectric material horizontally surrounding the conductive contact structures; and
a second dielectric material vertically overlying the first dielectric material and horizontally surrounding the conductive liner structures, portions of the conductive liner structures horizontally extending from the side surfaces of the digit line structures to the second dielectric material.

8. The memory of claim 7, wherein the conductive metal nitride structures are confined below a lower boundary of the second dielectric material.

9. The memory of claim 6, wherein the conductive metal nitride structures are confined below the lower surfaces of the digit line structures.

10. The memory of claim 6, wherein:
uppermost boundaries of the conductive liner structures are substantially coplanar with uppermost boundaries of the digit line structures; and
lowermost boundaries of the conductive liner structures are substantially coplanar with uppermost boundaries of the conductive metal nitride structures.

11. The memory of claim 6, wherein the digit line structures are substantially confined within horizontal boundaries of the conductive contact structures in the second horizontal direction.

12. The memory of claim 11, wherein the conductive liner structures are substantially confined within the horizontal boundaries of the conductive contact structures in the second horizontal direction.

13. The memory of claim 12, further comprising a dielectric oxide material vertically overlying the conductive metal nitride structures and in physical contact with outer side surfaces of the conductive liner structures, the dielectric oxide material partially horizontally overlapping the conductive contact structures in the second horizontal direction.

14. An electronic system, comprising:
  an input device;
  an output device;
  a processor device operably coupled to the input device and the output device; and
  a memory device operably coupled to the processor device and a microelectronic device structure comprising:
    a conductive contact structure;
    a conductive metal nitride structure on an upper surface the conductive contact structure and having a substantially planar upper surface;
    a conductive liner structure comprising beta phase tungsten on the substantially planar upper surface of the conductive metal nitride structure, the conductive liner structure having a non-planar upper surface; and
    an additional conductive structure vertically on and substantially horizontally surrounded by the conductive liner structure, the additional conductive structure and the conductive liner structure each substantially confined within horizontal boundaries of the conductive contact structure in at least one horizontal direction, and horizontal centers of the additional conductive structure, the conductive liner structure, the conductive metal nitride structure, and the conductive contact structure substantially aligned with one another in at least one horizontal direction.

15. The electronic system of claim 14, wherein the conductive contact structure is coupled to a vertically extending string of memory cells.

16. The electronic system of claim 14, wherein memory device comprises a 3D NAND Flash memory device.

* * * * *